(12) United States Patent
Koshimizu et al.

(10) Patent No.: US 12,057,294 B2
(45) Date of Patent: Aug. 6, 2024

(54) PLASMA PROCESSING APPARATUS AND PLASMA PROCESSING METHOD

(71) Applicant: Tokyo Electron Limited, Tokyo (JP)

(72) Inventors: Chishio Koshimizu, Miyagi (JP); Gen Tamamushi, Miyagi (JP); Masahiro Inoue, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/123,130

(22) Filed: Dec. 16, 2020

(65) Prior Publication Data

US 2021/0183622 A1  Jun. 17, 2021

(30) Foreign Application Priority Data

Dec. 17, 2019 (JP) .................... 2019-227670
Sep. 18, 2020 (JP) .................... 2020-157535

(51) Int. Cl.
*C23C 16/00* (2006.01)
*H01J 37/32* (2006.01)
*H01L 21/306* (2006.01)

(52) U.S. Cl.
CPC .. *H01J 37/32155* (2013.01); *H01J 37/32082* (2013.01); *H01J 37/32146* (2013.01); *H01J 37/32174* (2013.01); *H01J 37/32715* (2013.01)

(58) Field of Classification Search
CPC .......... H01J 37/32155; H01J 37/32146; H01J 37/32174; H01J 37/32082; H01J 37/32715; H01J 37/32165; H01J 37/32137; H01J 37/321; H01J 37/32192; H01L 21/02274; H01L 21/02315; H01L 21/3065; H01L 21/32136; H01L 21/76826
See application file for complete search history.

(56) References Cited

U.S. PATENT DOCUMENTS

| 5,571,366 A | * | 11/1996 | Ishii | ................... | H01J 37/3299 |
| | | | | | 216/60 |
| 2007/0235426 A1 | * | 10/2007 | Matsumoto | ....... | H01J 37/32082 |
| | | | | | 219/121.43 |
| 2009/0194508 A1 | * | 8/2009 | Ui | ..................... | H01J 37/32045 |
| | | | | | 156/345.24 |

(Continued)

FOREIGN PATENT DOCUMENTS

| JP | 10-64915 A | 3/1998 |
| JP | H1064696 A | 3/1998 |

(Continued)

*Primary Examiner* — Luz L Alejandro Mulero
(74) *Attorney, Agent, or Firm* — XSENSUS LLP

(57) ABSTRACT

An apparatus, method, and non-transitory computer-readable medium reduces the power level of a reflected wave from a load coupled to a radio-frequency power supply. A plasma processing apparatus includes a chamber, a substrate support, a radio-frequency power supply, a bias power supply, and a controller. The bias power supply periodically applies a pulsed negative voltage to the substrate support. The controller controls the radio-frequency power supply to provide radio-frequency power with a changed frequency within a period in which the pulsed negative voltage is applied from the bias power supply to the substrate support, to reduce a power level of a reflected wave from a load that is coupled to the radio-frequency power supply.

5 Claims, 12 Drawing Sheets

(56) References Cited

U.S. PATENT DOCUMENTS

| | | | | |
|---|---|---|---|---|
| 2010/0213162 A1* | 8/2010 | Mochiki | ........... | H01J 37/32091 |
| | | | | 216/17 |
| 2010/0276273 A1* | 11/2010 | Heckman | ............ | H01J 37/3299 |
| | | | | 204/298.04 |
| 2010/0300620 A1* | 12/2010 | Kanda | ............... | H01J 37/32935 |
| | | | | 156/345.28 |
| 2011/0235675 A1* | 9/2011 | Matsudo | ........... | H01L 21/67248 |
| | | | | 374/E11.001 |
| 2011/0309049 A1* | 12/2011 | Papasouliotis | .... | H01J 37/32412 |
| | | | | 427/523 |
| 2016/0064194 A1* | 3/2016 | Tokashiki | ......... | H01J 37/32577 |
| | | | | 156/345.28 |
| 2017/0062186 A1* | 3/2017 | Coumou | ............... | H01J 37/321 |
| 2018/0204757 A1* | 7/2018 | Fushimi | ............ | H01J 37/32174 |

FOREIGN PATENT DOCUMENTS

| | | | |
|---|---|---|---|
| JP | 2009-071133 A | 4/2009 | |
| JP | 2013-535074 A | 9/2013 | |

\* cited by examiner

PLASMA PROCESSING APPARATUS AND PLASMA PROCESSING METHOD

CROSS-REFERENCE TO RELATED APPLICATIONS

This application claims priority to Japanese Patent Application Nos. 2019-227670 filed on Dec. 17, 2019 and 2020-157535 filed on Sep. 18, 2020, the entire disclosures of each of which are incorporated herein by reference.

BACKGROUND

Technical Field

Exemplary embodiments of the present disclosure relate to a plasma processing apparatus and a plasma processing method.

Description of the Background

Plasma processing is performed on substrates using a plasma processing apparatus. Patent Literature 1 describes such a plasma processing apparatus. The plasma processing apparatus described in Patent Literature 1 includes a chamber, electrodes, a radio-frequency (RF) power supply, and an RF bias supply. The electrodes are accommodated in the chamber. A substrate is placed on the electrode. The RF power supply provides pulsed RF power to create an RF electric field in the chamber. The RF bias supply provides pulsed RF bias power to the electrode.

CITATION LIST

Patent Literature

Patent Literature 1: Japanese Unexamined Patent Application Publication No. 10-64915

BRIEF SUMMARY

The present disclosure is directed to an apparatus, a method, and a non-transitory computer-readable medium for reducing the power level of a reflected wave from a load coupled to a radio-frequency power supply.

A plasma processing apparatus according to an exemplary embodiment includes a chamber, a substrate support, a radio-frequency power supply, a bias power supply, and a controller. The substrate support includes a base and an electrostatic chuck. The electrostatic chuck is on the base. The substrate support supports a substrate placed on the substrate support in the chamber. The radio-frequency power supply is configured to generate radio-frequency power to be provided to generate plasma from a gas in the chamber. The bias power supply is electrically coupled to the substrate support to periodically apply a pulsed negative voltage (for example, negative direct-current voltage) to the substrate support. The controller is configured to control the radio-frequency power supply to provide the radio-frequency power with a changed frequency within a period in which the pulsed negative direct-current voltage is applied from the bias power supply to the substrate support, to reduce a power level of a reflected wave from a load coupled to the radio-frequency power supply.

The technique according to an exemplary embodiment reduces the power level of a reflected wave from a load coupled to a radio-frequency power supply.

DETAILED DESCRIPTION

Figure 1:
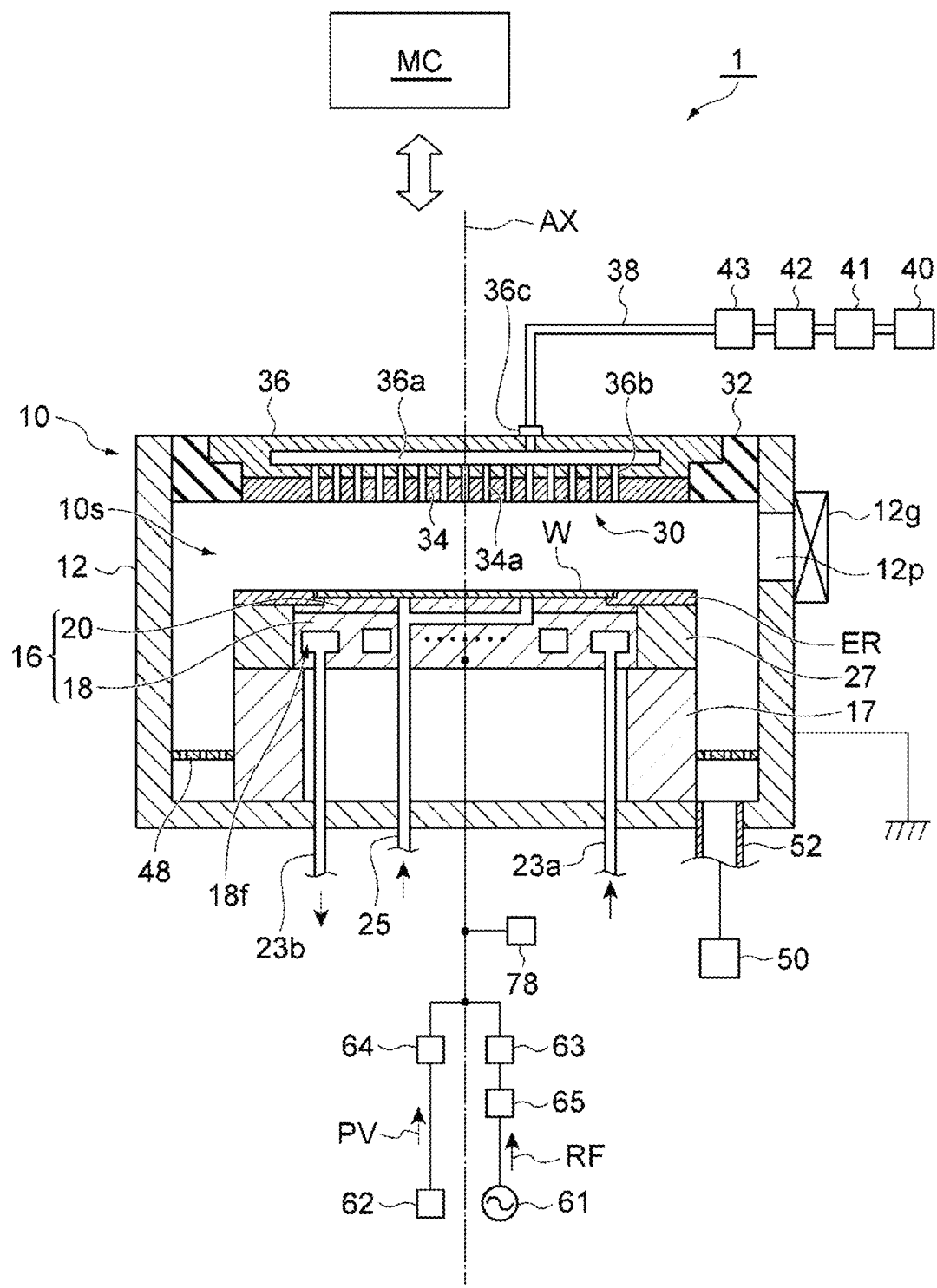
FIG. 1 is a schematic diagram of a plasma processing apparatus according to an exemplary embodiment.

Exemplary embodiments will now be described.

A plasma processing apparatus according to an exemplary embodiment includes a chamber, a substrate support, a radio-frequency power supply, a bias power supply, and a controller. The substrate support includes a base and an electrostatic chuck. The electrostatic chuck is on the base. The substrate support supports a substrate placed on the substrate support in the chamber. The radio-frequency power supply generates radio-frequency power to be provided to generate plasma from a gas in the chamber. The bias power supply is electrically coupled to the substrate support to periodically apply a pulsed negative direct-current voltage to the substrate support. The controller controls the radio-frequency power supply. The controller controls the radio-frequency power supply to provide the radio-frequency power with a changed frequency within a period in which the pulsed negative direct-current voltage is applied from the bias power supply to the substrate support, to reduce a power level of a reflected wave from a load coupled to the radio-frequency power supply.

The reflection from the load coupled to the radio-frequency power supply results from a difference between the output impedance of the radio-frequency power supply and the load impedance. The difference between the output impedance of the radio-frequency power supply and the load impedance can be reduced by changing the frequency of the radio-frequency power. The technique according to the embodiment can thus reduce the power level of a reflected wave from a load coupled to the radio-frequency power supply. The load impedance varies within each period in which the pulsed negative direct-current voltage is applied, or within each pulse cycle. A radio-frequency power supply typically provides radio-frequency power with the frequency changed at a higher rate than the rate of the impedance changed by an impedance matching circuit, or matcher. The technique according to the above embodiment can thus change the frequency of the radio-frequency power at a higher rate to reduce the power level of the reflected wave within each period in accordance with the varying load impedance.

In one exemplary embodiment, the controller may control the radio-frequency power supply to provide the radio-frequency power in at least a portion of a first sub-period included in the period. The controller may control the radio-frequency power supply to set a power level of the radio-frequency power supply to a lower power level in a second sub-period included in the period than in the first sub-period.

In one exemplary embodiment, the first sub-period may be a period in which the pulsed negative direct-current voltage is applied to the substrate support. The second sub-period may be a period in which the pulsed negative direct-current voltage is not applied to the substrate support.

In one exemplary embodiment, the first sub-period may be a period in which the pulsed negative direct-current voltage is not applied to the substrate support. The second sub-period may be a period in which the pulsed negative direct-current voltage is applied to the substrate support.

In one exemplary embodiment, the controller may control the radio-frequency power supply to change the frequency of the radio-frequency power in accordance with a phase within the period to reduce the power level of the reflected wave within the period. The controller may control the radio-frequency power supply to change the frequency of the radio-frequency power in accordance with a phase within the period using the relationship between the phase in the period and the frequency of the radio-frequency power determined in advance to reduce the power level of the reflected wave within the period.

A plasma processing method according to another exemplary embodiment is a method for performing plasma processing on a substrate placed on an electrostatic chuck in a plasma processing apparatus. The plasma processing apparatus includes a chamber, a substrate support, a radio-frequency power supply, and a bias power supply. The substrate support includes a base and an electrostatic chuck. The electrostatic chuck is on the base. While the term "on the base" is used herein, it should be understood that perhaps other components are located between the electrostatic chuck and the base. The substrate support supports a substrate placed on the substrate support in the chamber. The radio-frequency power supply generates radio-frequency power to be provided to generate plasma from a gas in the chamber. The bias power supply is electrically coupled to the substrate support. The plasma processing method includes periodically applying a pulsed negative direct-current voltage to the substrate support from the bias power supply. The plasma processing method includes providing the radio-frequency power with a changed frequency within a period in which the pulsed negative direct-current voltage is applied from the bias power supply to the substrate support, to reduce a power level of a reflected wave from a load coupled to the radio-frequency power supply.

In one exemplary embodiment, the radio-frequency power may be provided in at least a portion of a first sub-period included in the period. A power level of the radio-frequency power may be set to a lower power level in a second sub-period included in the period than in the first sub-period.

In one exemplary embodiment, the first sub-period may be a period in which the pulsed negative direct-current voltage is applied to the substrate support. The second sub-period may be a period in which the pulsed negative direct-current voltage is not applied to the substrate support.

In one exemplary embodiment, the first sub-period may be a period in which the pulsed negative direct-current voltage is not applied to the substrate support. The second sub-period may be a period in which the pulsed negative direct-current voltage is applied to the substrate support.

In one exemplary embodiment, the frequency of the radio-frequency power may be changed in accordance with a phase within the period to reduce the power level of the reflected wave within the period. The frequency of the radio-frequency power may be changed in accordance with a phase within the period using the relationship between the phase in the period and the frequency of the radio-frequency power determined in advance to reduce the power level of the reflected wave within the period.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

FIG. 1 is a schematic diagram of a plasma processing apparatus according to an exemplary embodiment. A plasma processing apparatus 1 shown in FIG. 1 is a capacitively coupled plasma processing apparatus. The plasma processing apparatus 1 includes a chamber 10 with an internal space 10s. The central axis in the internal space 10s is an axis AX extending in the vertical direction.

In one embodiment, the chamber 10 includes a chamber body 12, which is substantially cylindrical and has the internal space 10s. The chamber body 12 is formed from, for example, aluminum. The chamber body 12 is electrically grounded. The chamber body 12 has an inner wall defining the internal space 10s. The inner wall is coated with a plasma-resistant film (the term film and layer are used interchangeably herein), which may be a ceramic film such as an anodized film or a film formed from yttrium oxide.

The chamber body 12 has a side wall having a port 12p. A substrate W is transferred between the internal space 10s and the outside of the chamber 10 through the port 12p. A gate valve 12g is on the side wall of the chamber body 12 to open and close the port 12p.

The plasma processing apparatus 1 further includes a substrate support 16. The substrate support 16 supports the substrate W placed on the substrate support 16 in the chamber 10. The substrate W is substantially disk-shaped. The substrate support 16 is supported by a support 17. The support 17 extends upward from the bottom of the chamber body 12. The support 17 is substantially cylindrical and is formed from an insulating material such as quartz or alumina.

The substrate support 16 includes a base 18 and an electrostatic chuck (ESC) 20. The base 18 and the ESC 20 are accommodated in the chamber 10. The base 18 is substantially disk-shaped and is formed from a conductive material such as aluminum.

The base 18 has an internal channel 18f for a heat-exchange medium. Examples of the heat-exchange medium include a liquid refrigerant and a refrigerant (e.g., chlorofluorocarbon) that vaporizes and cools the base 18. The channel 18f is connected to a supply unit (e.g., chiller unit) for supplying the heat-exchange medium. The supply unit is external to the chamber 10. The heat-exchange medium is supplied from the supply unit to the channel 18f through a pipe 23a, and then returns to the supply unit through a pipe 23b.

The ESC 20 is on the base 18. The substrate W is placed onto and held by the ESC 20 for processing in the internal space 10s.

The ESC 20 includes a body and a chuck electrode 82. The body of the ESC 20 is formed from a dielectric such as aluminum oxide or aluminum nitride. The body of the ESC 20 is substantially disk-shaped. The ESC 20 has the central axis substantially aligned with the axis AX. The chuck electrode 82 is an electrode film located in the body. The chuck electrode 82 is electrically coupled to a direct-current (DC) power supply 84 via a switch. A voltage is applied from the DC power supply 84 to the chuck electrode 82 to generate an electrostatic attraction between the ESC 20 and the substrate W. The substrate W is attracted to and held by the ESC 20 under the generated electrostatic attraction.

The ESC 20 includes a substrate support portion. The substrate support portion is substantially disk-shaped and has the central axis substantially aligned with the axis AX. The substrate W is placed onto the upper surface of the substrate support portion for processing in the chamber 10.

In one embodiment, the ESC 20 may further include an edge ring support portion. The edge ring support portion extends circumferentially about the central axis of the ESC 20 to surround the substrate support portion. An edge ring ER is placed onto the upper surface of the edge ring support portion. The edge ring ER is annular and is placed onto the edge ring support portion with the central axis aligned with the axis AX. The substrate W is placed in an area defined by the edge ring ER. In other words, the edge ring ER surrounds an edge of the substrate W. The edge ring ER may be electrically conductive. The edge ring ER is formed from, for example, silicon or silicon carbide, but may be formed from a dielectric such as quartz.

The plasma processing apparatus 1 may further include a gas supply line 25. The gas supply line 25 supplies a heat-transfer gas (e.g., He gas) from a gas supply assembly to a space between an upper surface of the ESC 20 and a back surface (lower surface) of the substrate W.

The plasma processing apparatus 1 may further include an insulating portion 27. The insulating portion 27 is on the support 17. The insulating portion 27 is located outside the base 18 in the radial direction about the axis AX. The insulating portion 27 extends circumferentially along the outer peripheral surface of the base 18. The insulating portion 27 is formed from an insulator such as quartz. The edge ring ER is placed onto the insulating portion 27 and the edge ring support portion.

The plasma processing apparatus 1 further includes an upper electrode 30. The upper electrode 30 is located above the substrate support 16. The upper electrode 30 closes a top opening of the chamber body 12 together with an insulating member 32. The upper electrode 30 is supported on an upper portion of the chamber body 12 with the insulating member 32.

The upper electrode 30 includes a ceiling plate 34 and a support member 36. The ceiling plate 34 has its lower surface defining the internal space 10s. The ceiling plate 34 has multiple gas outlet holes 34a that are through-holes in the thickness direction (vertical direction). The ceiling plate 34 is formed from, but not limited to, silicon. In some embodiments, the ceiling plate 34 may be an aluminum member coated with a plasma-resistant film. The film may be a ceramic film, such as an anodized film or a film formed from yttrium oxide.

The support member 36 supports the ceiling plate 34 in a detachable manner. The support member 36 is formed from a conductive material such as aluminum. The support member 36 has an internal gas-diffusion compartment 36a. Multiple gas holes 36b extend downward from the gas-diffusion compartment 36a. The gas holes 36b communicate with the respective gas outlet holes 34a. The support member 36 has a gas inlet 36c that connects to the gas-diffusion compartment 36a and to a gas supply pipe 38.

The gas supply pipe 38 is connected to a set of gas sources 40 via a set of valves 41, a set of flow controllers 42, and a set of valves 43. The gas source set 40, the valve set 41, the flow controller set 42, and the valve set 43 form a gas supply unit. The gas source set 40 includes multiple gas sources. The valve sets 41 and 43 each include multiple valves (e.g., open-close valves). The flow controller set 42 includes multiple flow controllers. The flow controllers in the flow controller set 42 are mass flow controllers or pressure-based flow controllers. The gas sources in the gas source set 40 are connected to the gas supply pipe 38 via the respective valves in the valve set 41, via the respective flow controllers in the flow controller set 42, and via the respective valves in the valve set 43. The plasma processing apparatus 1 can supply gas from one or more gas sources selected from the multiple gas sources in the gas source set 40 to the internal space 10s at an individually regulated flow rate.

A baffle plate 48 is located between the substrate support 16 or the support 17 and the side wall of the chamber body 12. The baffle plate 48 may include, for example, an aluminum member covered with ceramic such as yttrium oxide. The baffle plate 48 has many through-holes. An exhaust pipe 52 is connected to the bottom of the chamber body 12 below the baffle plate 48. The exhaust pipe 52 is connected to an exhaust device 50. The exhaust device 50 includes a pressure controller such as an automatic pressure control valve and a vacuum pump such as a turbomolecular pump to reduce the pressure in the internal space 10s.

The plasma processing apparatus 1 further includes a radio-frequency (RF) power supply 61. The RF power supply 61 generates radio-frequency power RF. The radio-frequency power RF is used to generate plasma from a gas in the chamber 10. The radio-frequency power RF may, for example, have a frequency ranging from 27 to 100 MHz. The RF power supply 61 provides the radio-frequency power RF to the substrate support 16 (the base 18 in one example). In one embodiment, the RF power supply 61 is coupled to the base 18, which serves as a lower electrode, via a matching circuit 63. The matching circuit 63 matches the output impedance of the RF power supply 61 and the impedance of a load (e.g., base 18), or the load impedance. The RF power supply 61 may further be coupled to the base 18 via a power sensor 65. The power sensor 65 may include a directional coupler and a reflected wave power detector. The directional coupler provides a reflected wave from the load coupled to the RF power supply 61 at least partially to the reflected wave power detector. The reflected wave power detector detects the power level of the reflected wave received from the directional coupler. The RF power supply 61 may not be electrically coupled to the base 18, and may be coupled to the upper electrode 30 via the matching circuit 63.

The plasma processing apparatus 1 further includes a bias power supply 62. The bias power supply 62 is electrically coupled to the substrate support 16 (the base 18 in one example). In one embodiment, the bias power supply 62 is electrically coupled to the base 18 via a low-pass filter 64. The bias power supply 62 periodically applies a pulsed negative DC voltage PV to the base 18 in repeated periods $P_P$, or in pulse cycles. The frequency that defines the periods $P_P$ is lower than the frequency of the radio-frequency power RF. The frequency that defines the periods $P_P$ ranges from, for example, 50 kHz to 27 MHz inclusive. The period $P_P$ includes a first sub-period $P_1$ and a second sub-period $P_2$. In one embodiment, the first sub-period $P_1$ may be a period in which the pulsed negative DC voltage PV is applied to the base 18, and the second sub-period $P_2$ may be a period in which the pulsed negative DC voltage PV is not applied to the base 18. In another embodiment, the first sub-period $P_1$ may be a period in which the pulsed negative DC voltage PV is not applied to the base 18, and the second sub-period $P_2$ may be a period in which the pulsed negative DC voltage PV is applied to the base 18.

A gas is supplied into the internal space 10s for plasma processing in the plasma processing apparatus 1. The radio-frequency power RF is provided to excite the gas in the internal space 10s, generating plasma in the internal space 10s. The substrate W supported on the substrate support 16 is processed with chemical species, such as ions and radicals contained in the generated plasma. The substrate W is etched with, for example, a chemical species in the plasma. In the plasma processing apparatus 1, the pulsed negative DC voltage PV is applied to the base 18, thus accelerating ions in the plasma toward the substrate W.

The plasma processing apparatus 1 may further include a controller MC that controls the components of the plasma processing apparatus 1. The controller MC is a computer including a processor, a storage, an input device, and a display. The controller MC, which may be implemented as the processing circuitry 805, discussed later in reference to FIG. 11, executes a control program stored in the storage to control the components of the plasma processing apparatus 1 in accordance with recipe data stored in the storage. As controlled by the controller MC, the plasma processing apparatus 1 performs a process specified by the recipe data. A plasma processing method (described later) may be implemented by the components of the plasma processing apparatus 1 as controlled by the controller MC.

In one embodiment, the controller MC may control the RF power supply 61 to provide the radio-frequency power RF in at least a portion of the first sub-period $P_1$ included in the period $P_P$. In the plasma processing apparatus 1, the radio-frequency power RF is provided to the base 18, or may be provided to the upper electrode 30 in some embodiments. The controller MC may set the power level of the radio-frequency power RF in the second sub-period $P_2$ included in the period $P_P$ to a lower power level than in the first sub-period $P_1$. More specifically, the controller MC may control the RF power supply 61 to provide one or more pulses of the radio-frequency power RF in the first sub-period $P_1$.

The power level of the radio-frequency power RF in the second sub-period $P_2$ may be 0 W. More specifically, the controller MC may control the RF power supply 61 to stop providing the radio-frequency power RF in the second sub-period $P_2$. In some embodiments, the power level of the radio-frequency power RF in the second sub-period $P_2$ may be higher than 0 W.

The controller MC can provide a synchronization pulse, a delay duration, and a powering duration to the RF power supply 61. The synchronization pulse is synchronized with the pulsed negative DC voltage PV. The delay duration is the length of the delay time from the start of the period $P_P$ specified by the synchronization pulse. The powering duration is the length of time for which the radio-frequency power RF is provided. The RF power supply 61 provides one or more pulses of radio-frequency power RF for the powering duration from a time point delayed from the start of the period $P_P$ by the delay duration. The radio-frequency power RF is thus provided to the base 18 in the first sub-period $P_1$. The delay duration may be zero.

In one embodiment, the plasma processing apparatus 1 may further include a voltage sensor 78. The voltage sensor 78 directly or indirectly measures the potential of the substrate W. In the example shown in FIG. 1, the voltage sensor 78 measures the potential of the base 18. More specifically, the voltage sensor 78 measures the potential of a feed line coupled between the base 18 and the bias power supply 62.

The controller MC may define, as the first sub-period $P_1$, a period in which the potential of the substrate W measured by the voltage sensor 78 is higher or lower than the average value $V_{AVE}$ of the potential of the substrate W in the period $P_P$. The controller MC may define, as the second sub-period $P_2$, a period in which the potential of the substrate W measured by the voltage sensor 78 is lower or higher than the average value $V_{AVE}$. The average value $V_{AVE}$ of the potential of the substrate W may be a predetermined value. The controller MC may control the RF power supply 61 to provide the radio-frequency power RF in the manner described above in the defined first sub-period $P_1$. The controller MC may also control the RF power supply 61 to set the power level of the radio-frequency power RF in the manner described above in the defined second sub-period $P_2$. The plasma processing apparatus 1 may include, in place of the voltage sensor 78, another sensor (e.g., a current sensor) that can obtain measurement values to be used in defining the first sub-period $P_1$ and the second sub-period $P_2$ in the period $P_P$.

To reduce the power level of the reflected wave from the load coupled to the RF power supply 61, the controller MC controls the RF power supply 61 to provide the radio-frequency power RF with the changed frequency within each period $P_P$. The relationship between the phase in the period $P_P$ and the frequency of the radio-frequency power RF to reduce the power level of the reflected wave in the period $P_P$ may be determined in advance before or during plasma processing on the substrate W in the plasma processing apparatus 1. The data representing the relationship is stored into the storage in the controller MC in the form of a function or a table. The controller MC uses the relationship to control the RF power supply 61. The relationship is obtained by detecting the power level of a reflected wave using the power sensor 65 while the frequency of the radio-frequency power RF at each phase in the period $P_P$ is being changed and by determining the frequency of the radio-frequency power RF that reduces or minimizes the power level of the reflected wave at each phase in the period $P_P$.

The reflection from the load coupled to the RF power supply 61 results from a difference between the output impedance of the RF power supply 61 and the load impedance. The difference between the output impedance of the RF power supply 61 and the load impedance can be reduced by changing the frequency of the radio-frequency power RF. In the plasma processing apparatus 1, the power level of the reflected wave from the load coupled to the RF power supply 61 can thus be reduced. The load impedance varies within each period $P_P$ in which the pulsed negative DC voltage PV is applied. An RF power supply typically provides RF power with the frequency changed at a higher rate than the rate of the impedance changed by an impedance matching circuit, or matcher. The plasma processing apparatus 1 can thus change the frequency of the radio-frequency power RF at a higher rate to reduce the power level of the reflected wave within each period $P_P$ in accordance with the varying load impedance.

The potential difference between the plasma and the base 18 (or the substrate W) is relatively large in the period in which the pulsed negative DC voltage PV is applied to the base 18. Thus, in the period in which the pulsed negative DC voltage PV is applied to the base 18, secondary electrons generated by the impact of ions striking on the substrate W are accelerated due to the large potential difference between the plasma and the base 18, which is applied to the sheath above the substrate W, to obtain a large amount of energy. The secondary electrons thus have relatively high energy in the period in which the pulsed negative DC voltage PV is applied to the base 18, increasing the temperature of the electrons and the degree of gas dissociation in the plasma. The potential difference between the plasma and the base 18 (or the substrate W) is relatively small in the period in which the pulsed negative DC voltage PV is not applied to the base 18. The secondary electrons thus have relatively low energy with the small potential difference for accelerating the secondary electrons in the period in which the pulsed negative DC voltage PV is not applied to the base 18, decreasing the temperature of the electrons and the degree of gas dissociation in the plasma. The plasma processing apparatus 1 can thus control the temperature of the electrons and the degree of gas dissociation in the plasma.

FIGS. 2 to 9 are example timing charts each showing a pulsed negative DC voltage, the level of RF power, and the frequency of the RF power. In FIGS. 2 to 9, VO indicates the output voltage of the bias power supply 62, RF power indicates the power level of the radio-frequency power RF, and RF frequency indicates the frequency of the radio-frequency power RF.

Figure 2:
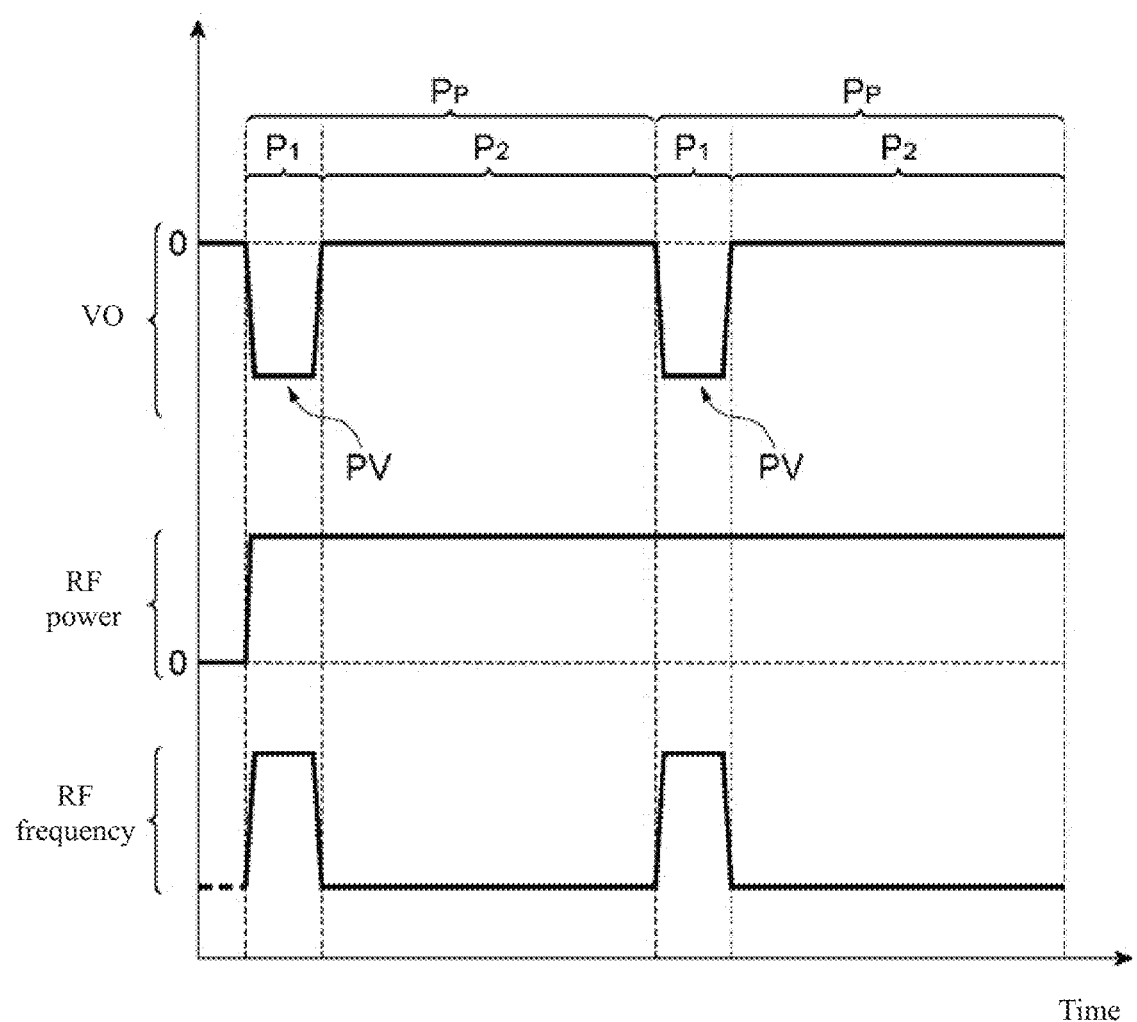
FIG. 2 is an example timing chart showing a pulsed negative direct-current (DC) voltage, the level of radio-frequency (RF) power, and the frequency of the RF power.

In the example shown in FIG. 2, the first sub-period $P_1$ is a period in which the pulsed negative DC voltage PV is applied to the base 18. In the example shown in FIG. 2, the second sub-period $P_2$ is a period in which the pulsed negative DC voltage PV is not applied to the base 18. In the example shown in FIG. 2, the controller MC controls the RF power supply 61 to continuously provide the radio-frequency power RF to generate plasma in repeated periods $P_P$. In the example shown in FIG. 2, the frequency of the radio-frequency power RF increases in a transitional period in which the pulsed negative DC voltage PV changes from 0 V to a negative peak voltage (hereinafter referred to as a first transitional period). In the example shown in FIG. 2, the frequency of the radio-frequency power RF decreases in a transitional period in which the pulsed negative DC voltage PV changes from the negative peak voltage to 0 V (hereinafter referred to as a second transitional period). In the example shown in FIG. 2, the frequency of the radio-frequency power RF in the first sub-period $P_1$ is set to a frequency higher than the frequency of the radio-frequency power RF in the second sub-period $P_2$.

Figure 3:
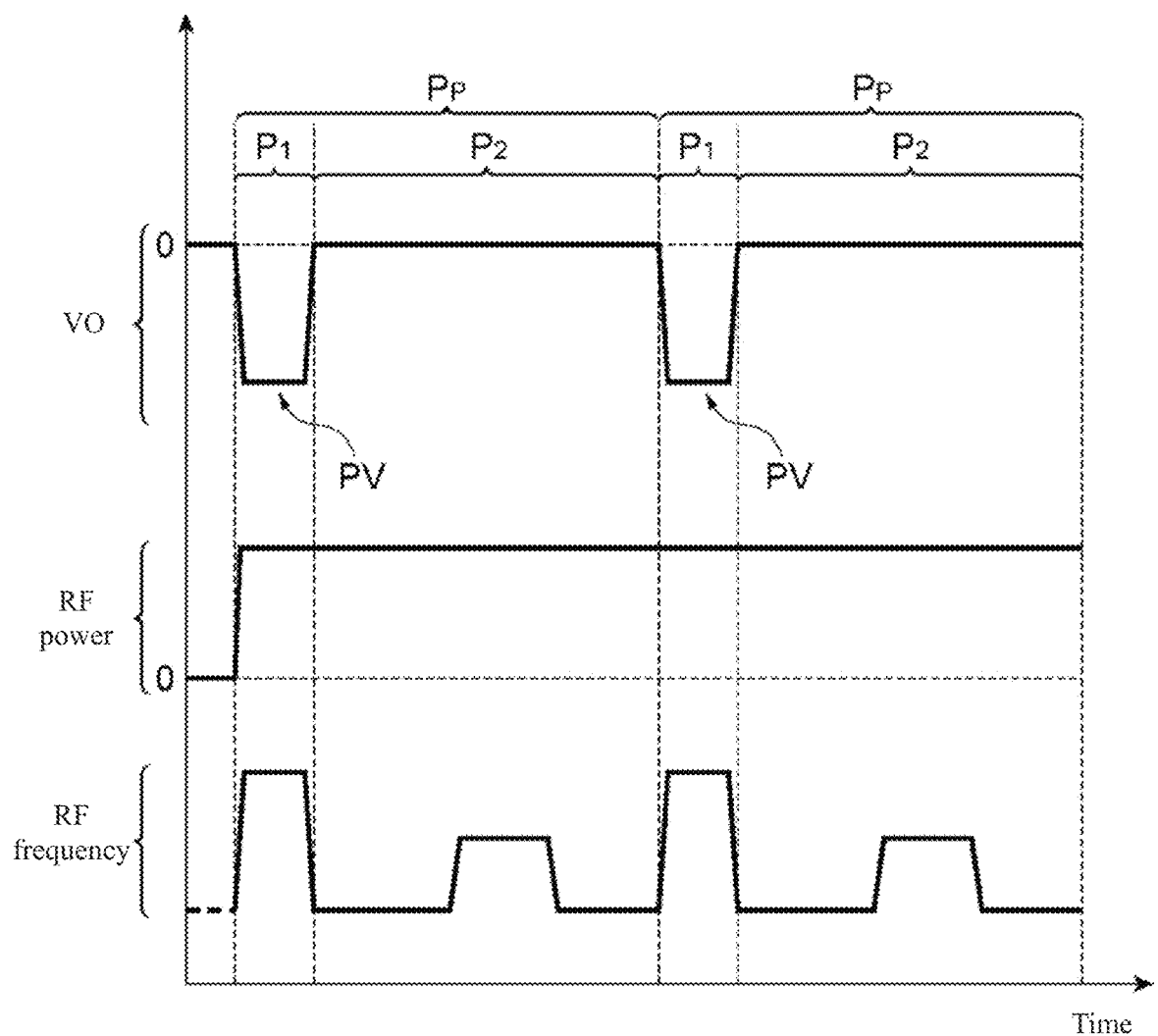
FIG. 3 is an example timing chart showing a pulsed negative DC voltage, the level of RF power, and the frequency of the RF power.

FIG. 3 is another example timing chart showing a pulsed negative DC voltage, the level of RF power, and the frequency of the RF power. The timing chart shown in FIG. 3 differs from the timing chart shown in FIG. 2 in that the frequency of the radio-frequency power RF is changed in the second sub-period $P_2$ as well. As shown in the example in FIG. 3, the frequency of the radio-frequency power RF may be changed one or more times at least in the first sub-period $P_1$ or in the second sub-period $P_2$. More specifically, the frequency of the radio-frequency power RF may be changed at least in the first sub-period $P_1$ or in the second sub-period $P_2$.

Figure 4:
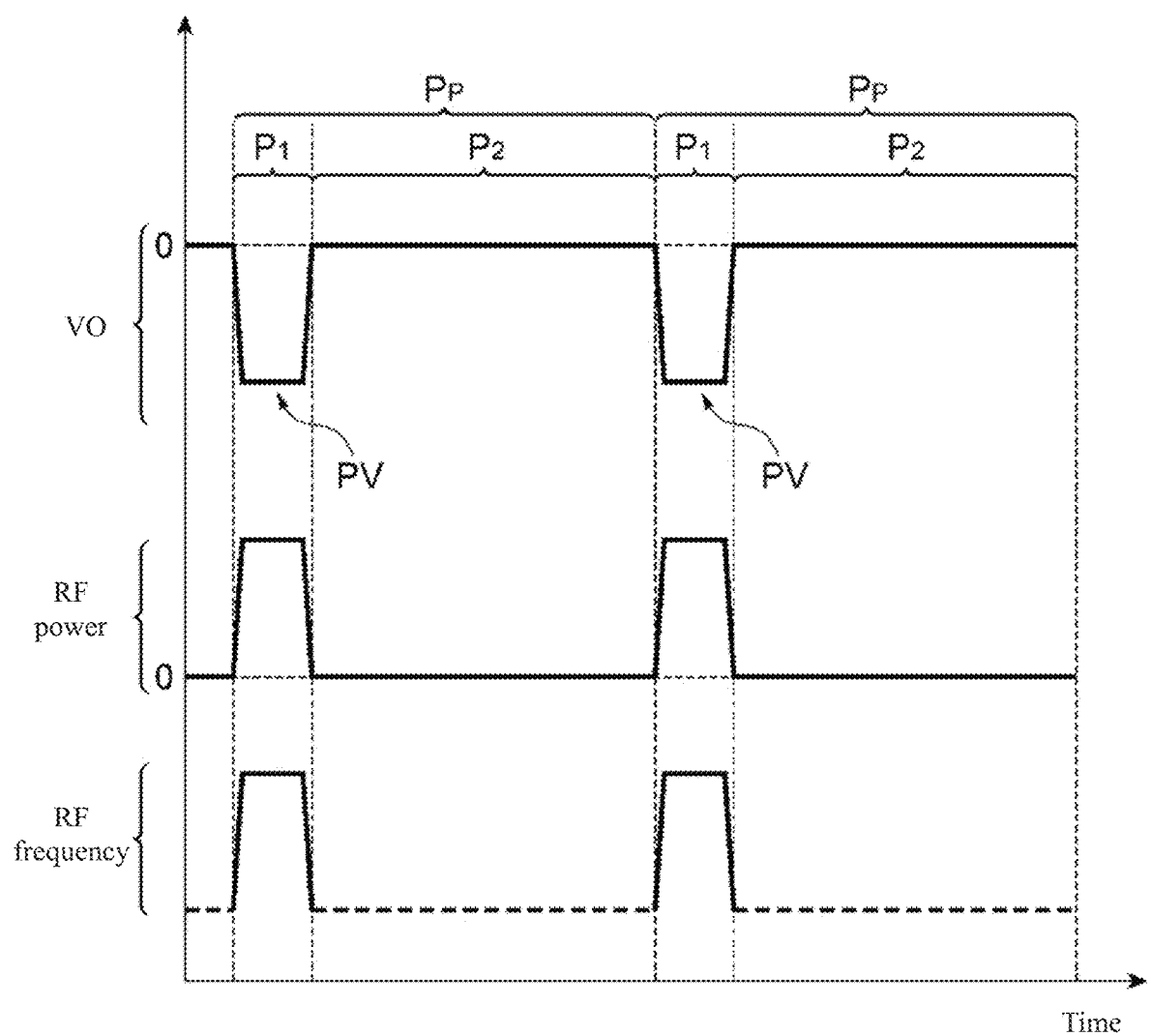
FIG. 4 is an example timing chart showing a pulsed negative DC voltage, the level of RF power, and the frequency of the RF power.

In the example shown in FIG. 4, the first sub-period $P_1$ is a period in which the pulsed negative DC voltage PV is applied to the base 18. In the example shown in FIG. 4, the second sub-period $P_2$ is a period in which the pulsed negative DC voltage PV is not applied to the base 18. In the example shown in FIG. 4, the controller MC controls the RF power supply 61 to provide the radio-frequency power RF in the first sub-period $P_1$ and to stop providing the radio-frequency power RF in the second sub-period $P_2$. More specifically, in the example shown in FIG. 4, the controller MC controls the RF power supply 61 to provide a pulse of the radio-frequency power RF in the first sub-period $P_1$. In the example shown in FIG. 4, the frequency of the radio-frequency power RF increases in the first transitional period. In the example shown in FIG. 4, the frequency of the radio-frequency power RF decreases in the second transitional period.

Figure 5:
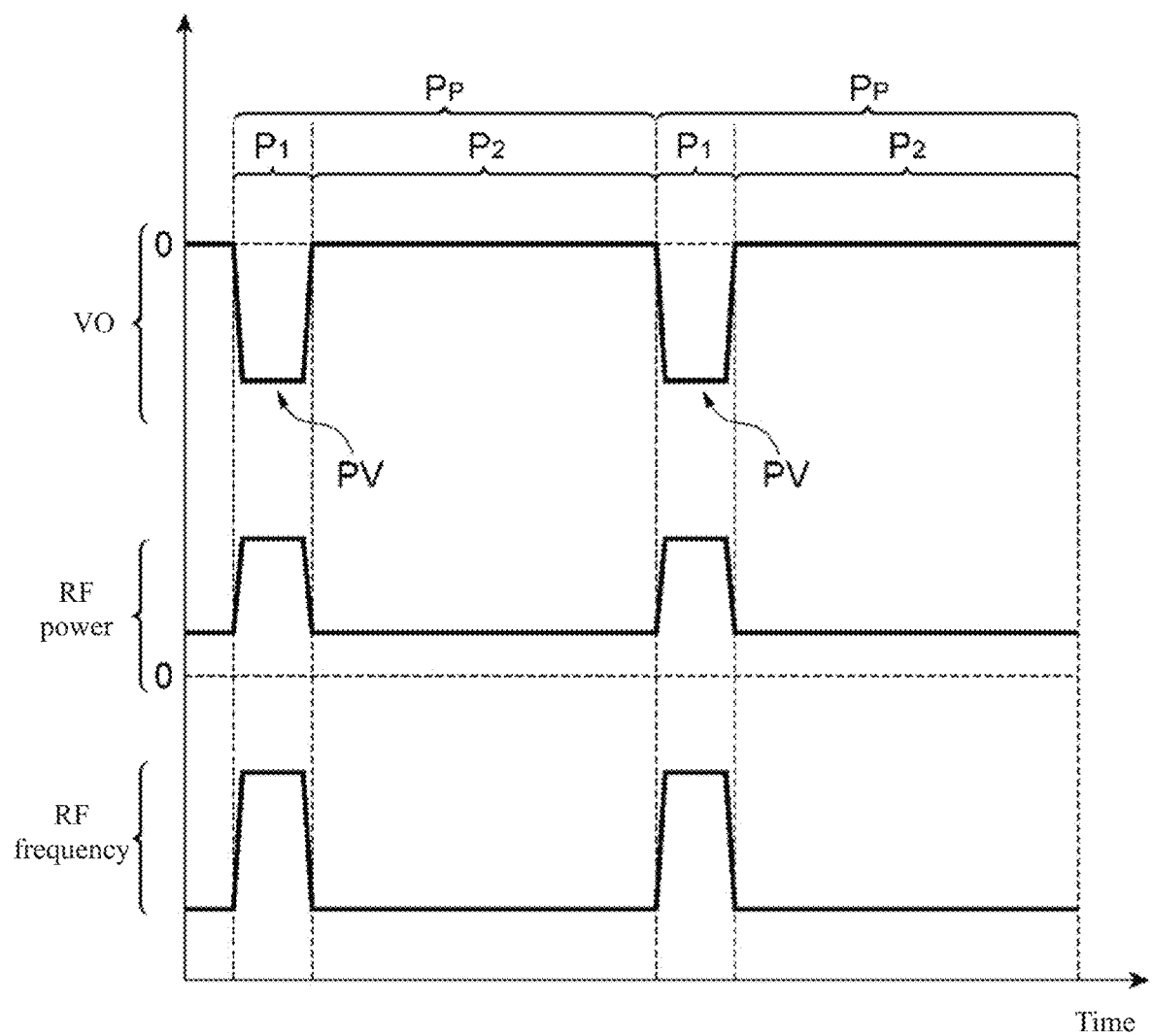
FIG. 5 is an example timing chart showing a pulsed negative DC voltage, the level of RF power, and the frequency of the RF power.

In the example shown in FIG. 5, the first sub-period $P_1$ is a period in which the pulsed negative DC voltage PV is applied to the base 18. In the example shown in FIG. 5, the second sub-period $P_2$ is a period in which the pulsed negative DC voltage PV is not applied to the base 18. In the example shown in FIG. 5, the controller MC controls the RF power supply 61 to provide the radio-frequency power RF in the first sub-period $P_1$. In the example shown in FIG. 5, the controller MC controls the RF power supply 61 to set the power level of the radio-frequency power RF in the second sub-period $P_2$ to a power level higher than 0 W and lower than in the first sub-period $P_1$. In the example shown in FIG. 5, the frequency of the radio-frequency power RF increases in the first transitional period. In the example shown in FIG. 5, the frequency of the radio-frequency power RF decreases in the second transitional period. In the example shown in FIG. 5, the radio-frequency power RF has a higher frequency in the first sub-period $P_1$ than in the second sub-period $P_2$.

Figure 6:
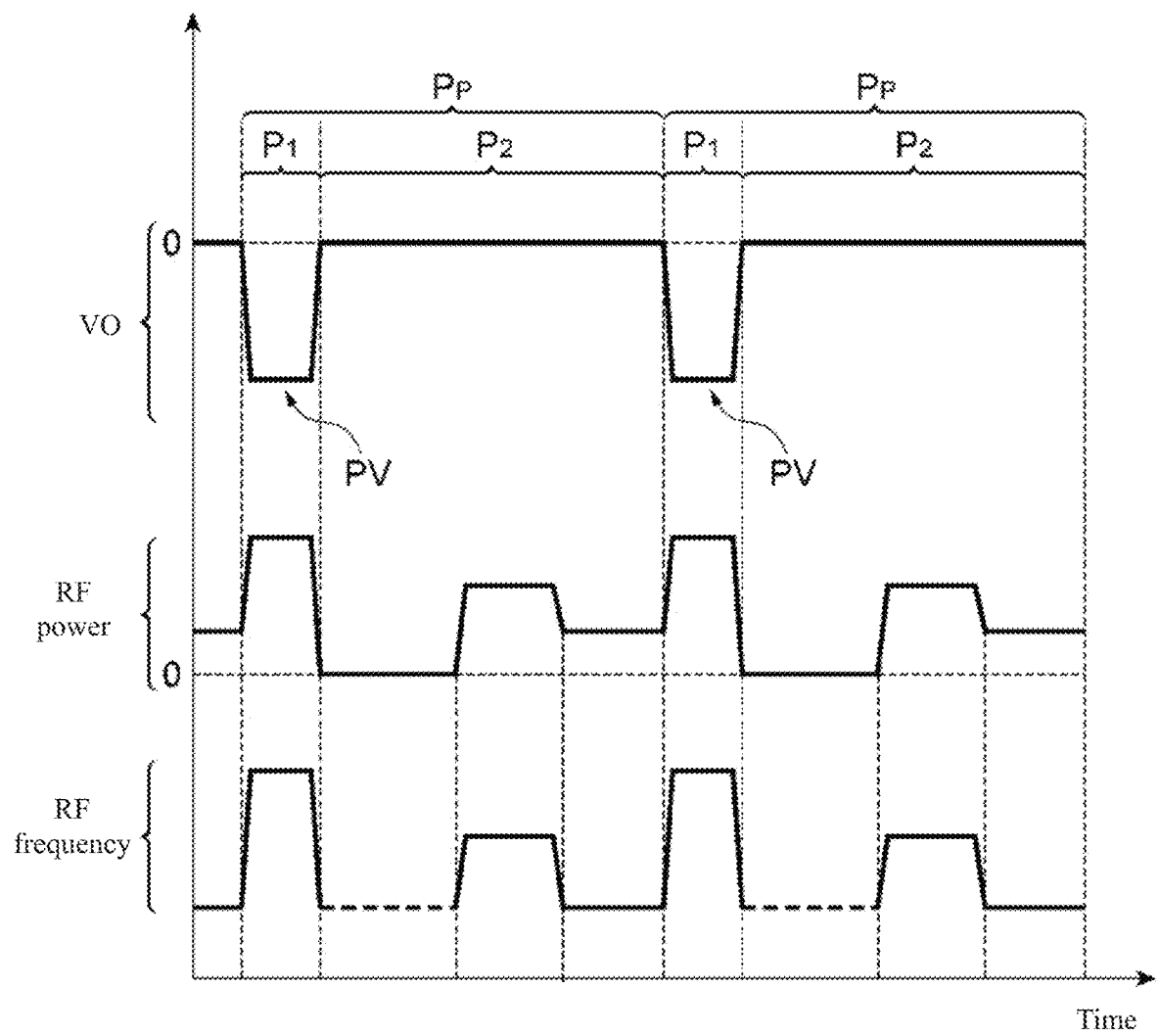
FIG. 6 is an example timing chart showing a pulsed negative DC voltage, the level of RF power, and the frequency of the RF power.

In the example shown in FIG. 6, the first sub-period $P_1$ is a period in which the pulsed negative DC voltage PV is applied to the base 18. In the example shown in FIG. 6, the second sub-period $P_2$ is a period in which the pulsed negative DC voltage PV is not applied to the base 18. In the example shown in FIG. 6, the controller MC controls the RF power supply 61 to provide the radio-frequency power RF in the first sub-period $P_1$. In the example shown in FIG. 6, the controller MC controls the RF power supply 61 to set the power level of the radio-frequency power RF in the second sub-period $P_2$ to a power level lower than in the first sub-period $P_1$. In the example shown in FIG. 6, the controller MC also controls the RF power supply 61 to change the power level of the radio-frequency power RF in the second sub-period $P_2$. As shown in this example, the controller MC may control the RF power supply 61 to change the power level of the radio-frequency power RF one or more times at least in the first sub-period $P_1$ or in the second sub-period $P_2$.

In the example shown in FIG. 6, the frequency of the radio-frequency power RF increases in the first transitional period. In the example shown in FIG. 6, the frequency of the radio-frequency power RF decreases in the second transitional period. In the example shown in FIG. 6, the radio-frequency power RF has a higher frequency in the first sub-period $P_1$ than in the second sub-period $P_2$. In the example shown in FIG. 6, the frequency of the radio-frequency power RF increases in the period in which the radio-frequency power RF increases. In the example shown in FIG. 6, the frequency of the radio-frequency power RF decreases in the period in which the radio-frequency power RF decreases. In the example shown in FIG. 6, the radio-frequency power RF has a higher frequency in the period in which its power level is high than in the period in which its power level is low.

Figure 7:
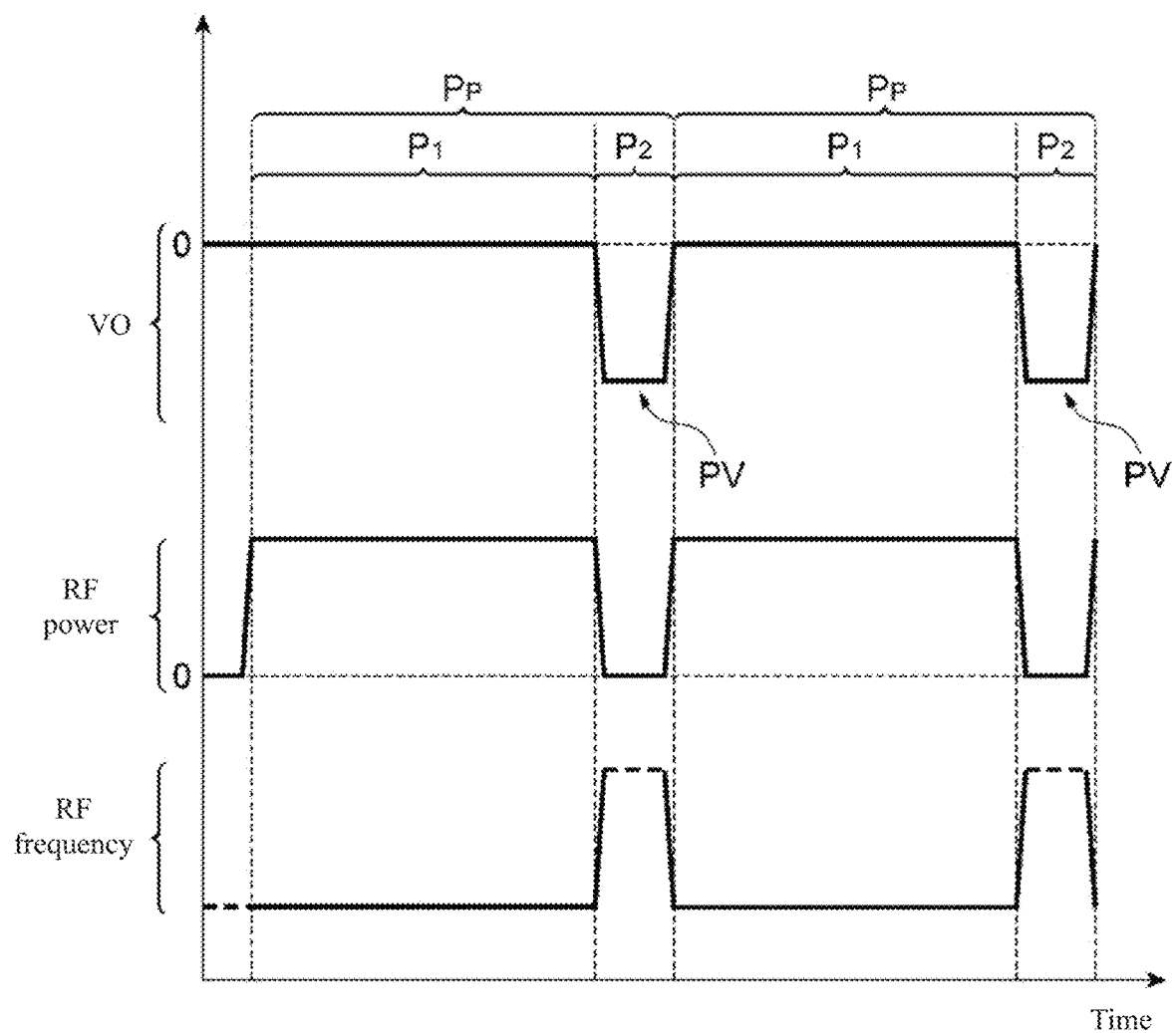
FIG. 7 is an example timing chart showing a pulsed negative DC voltage, the level of RF power, and the frequency of the RF power.

In the example shown in FIG. 7, the first sub-period $P_1$ is a period in which the pulsed negative DC voltage PV is not applied to the base 18. In the example shown in FIG. 7, the second sub-period $P_2$ is a period in which the pulsed negative DC voltage PV is applied to the base 18. In the example shown in FIG. 7, the controller MC controls the RF power supply 61 to provide the radio-frequency power RF in the first sub-period $P_1$ and to stop providing the radio-frequency power RF in the second sub-period $P_2$. More specifically, in the example shown in FIG. 7, the controller MC controls the RF power supply 61 to provide a pulse of the radio-frequency power RF in the first sub-period $P_2$. In the example shown in FIG. 7, the frequency of the radio-frequency power RF increases in the first transitional period. In the example shown in FIG. 7, the frequency of the radio-frequency power RF decreases in the second transitional period.

Figure 8:
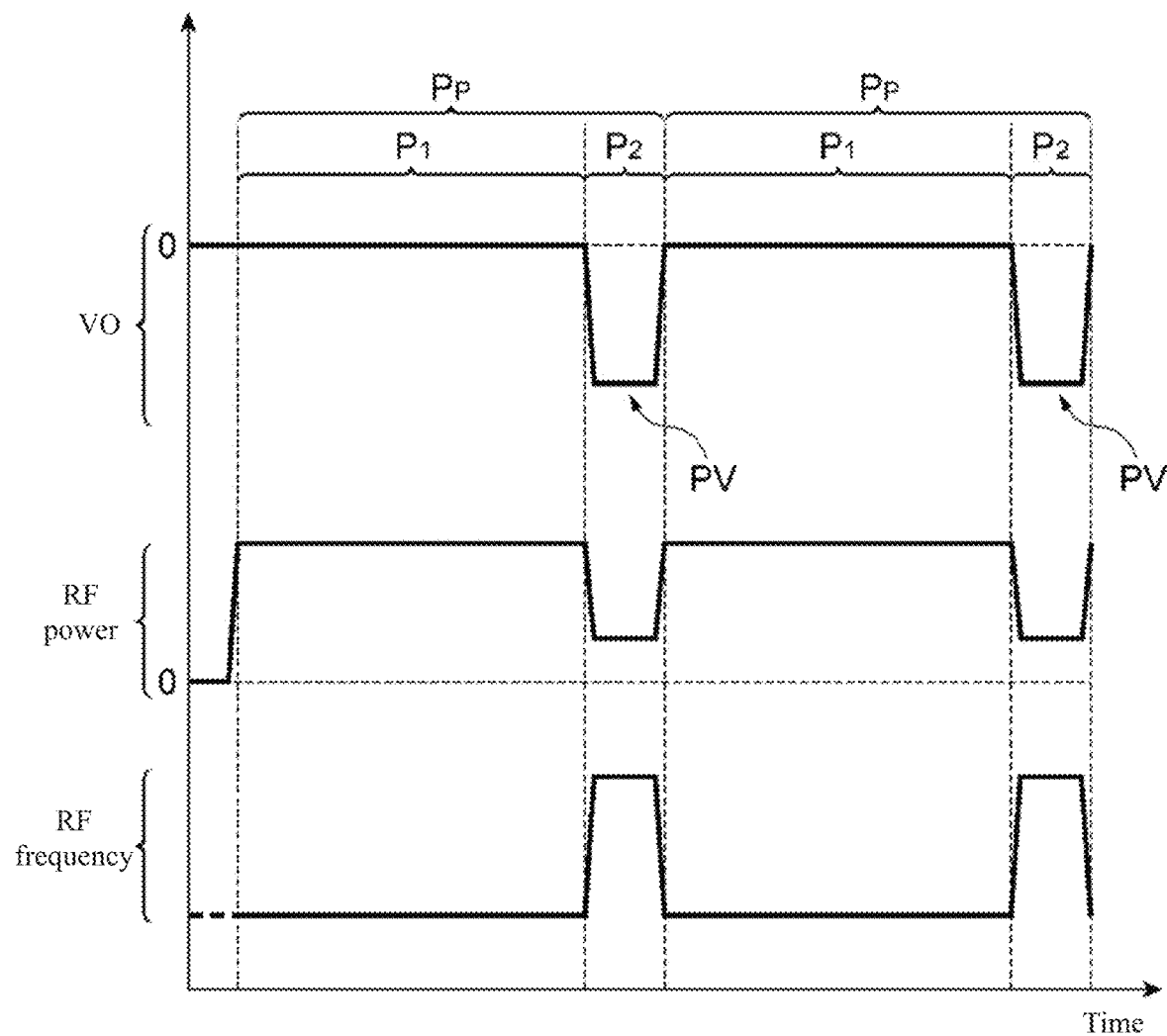
FIG. 8 is an example timing chart showing a pulsed negative DC voltage, the level of RF power, and the frequency of the RF power.

In the example shown in FIG. 8, the first sub-period $P_1$ is a period in which the pulsed negative DC voltage PV is not applied the base 18. In the example shown in FIG. 8, the second sub-period $P_2$ is a period in which the pulsed negative DC voltage PV is applied to the base 18. In the example shown in FIG. 8, the controller MC controls the RF power supply 61 to provide the radio-frequency power RF in the first sub-period $P_1$. In the example shown in FIG. 8, the controller MC controls the RF power supply 61 to set the power level of the radio-frequency power RF in the second sub-period $P_2$ to a power level higher than 0 W and lower than in the first sub-period $P_1$. In the example shown in FIG. 8, the frequency of the radio-frequency power RF increases in the first transitional period. In the example shown in FIG. 8, the frequency of the radio-frequency power RF decreases in the second transitional period. In the example shown in FIG. 8, the radio-frequency power RF has a lower frequency in the first sub-period $P_1$ than in the second sub-period $P_2$.

Figure 9:
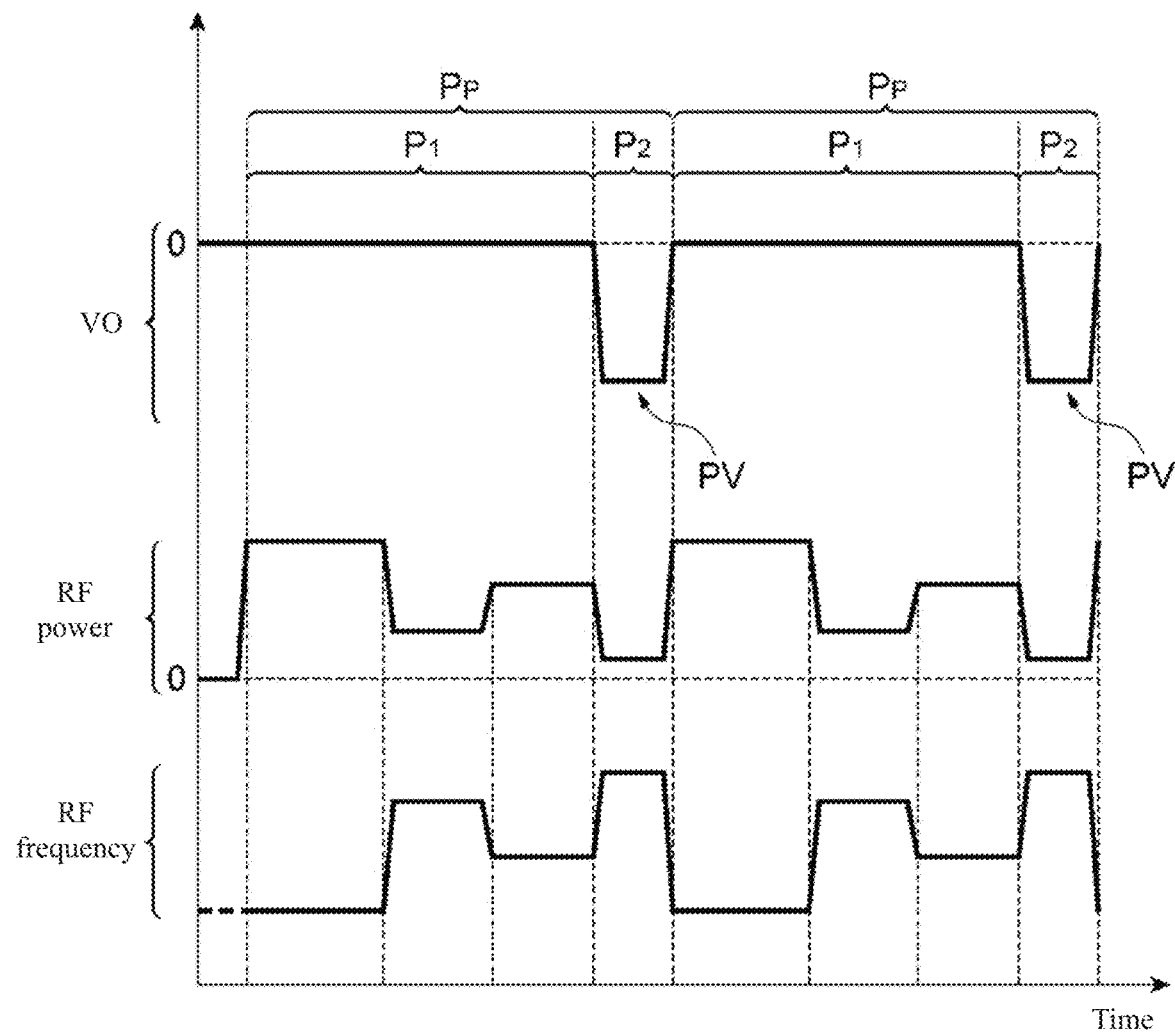
FIG. 9 is an example timing chart showing a pulsed negative DC voltage, the level of RF power, and the frequency of the RF power.

In the example shown in FIG. 9, the first sub-period $P_1$ is a period in which the pulsed negative DC voltage PV is not applied to the base 18. In the example shown in FIG. 9, the second sub-period $P_2$ is a period in which the pulsed negative DC voltage PV is applied to the base 18. In the example shown in FIG. 9, the controller MC controls the RF power supply 61 to provide the radio-frequency power RF in the first sub-period $P_1$. In the example shown in FIG. 9, the controller MC controls the RF power supply 61 to set the power level of the radio-frequency power RF in the second sub-period $P_2$ to a lower power level than in the first sub-period $P_1$. In the example shown in FIG. 9, the controller MC controls the RF power supply 61 to change the power level of the radio-frequency power RF in the first sub-period $P_1$. As shown in this example, the controller MC may control the RF power supply 61 to change the power level of the radio-frequency power RF one or more times at least in the first sub-period $P_1$ or in the second sub-period $P_2$.

In the example shown in FIG. 9, the frequency of the radio-frequency power RF increases in the first transitional period. In the example shown in FIG. 9, the frequency of the radio-frequency power RF decreases in the second transitional period. In the example shown in FIG. 9, the radio-frequency power RF has a lower frequency in the first sub-period $P_1$ than in the second sub-period $P_2$. In the example shown in FIG. 9, the frequency of the radio-frequency power RF decreases in the period in which the radio-frequency power RF increases. In the example shown in FIG. 9, the frequency of the radio-frequency power RF increases in the period in which the radio-frequency power RF decreases. In the example shown in FIG. 9, the radio-frequency power RF has a higher frequency in the period in which its power level is high than in the period in which its power level is low. As shown in the example in FIG. 9, the frequency of the radio-frequency power RF may be changed one or more times at least in the first sub-period $P_1$ or in the second sub-period $P_2$. More specifically, the frequency of the radio-frequency power RF may be changed at least in the first sub-period $P_1$ or in the second sub-period $P_2$.

Figure 10:
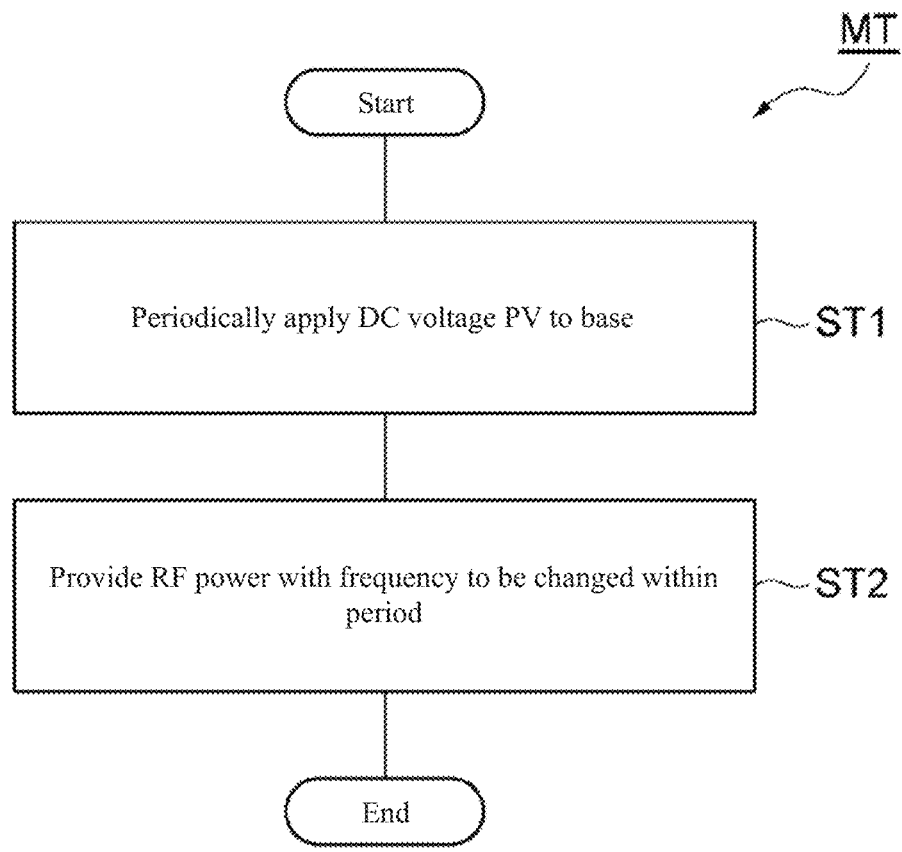
FIG. 10 is a flowchart of a plasma processing method according to an exemplary embodiment.

FIG. 10 is a flowchart of a plasma processing method according to an exemplary embodiment. The plasma processing method shown in FIG. 10 (hereinafter referred to as the method MT) can be implemented using the plasma processing apparatus 1 described above.

The method MT is implemented with the substrate W placed on the ESC 20. The method MT is used to perform plasma processing on the substrate W. With the method MT, a gas is supplied from the gas supply unit into the chamber 10. The gas in the chamber 10 is set to a specified pressure by the exhaust device 50.

The method MT includes step ST1. In step ST1, the bias power supply 62 periodically applies the pulsed negative DC voltage PV to the base 18 in repeated periods $P_P$.

Step ST2 is performed during step ST1. In step ST2, the radio-frequency power RF with the changed frequency within each period $P_P$ is provided to reduce the power level of the reflected wave from the load coupled to the RF power supply 61. The setting of the frequency of the radio-frequency power RF in accordance with the phase within the period $P_P$ and the examples are described above referring to FIGS. 2 to 9.

In one embodiment, the RF power supply 61 may provide the radio-frequency power RF in at least a portion of the first sub-period $P_1$ included in the period $P_P$. In one embodiment, the power level of the radio-frequency power RF in the second sub-period $P_2$ included in the period $P_P$ may beset to a lower power level than in the first sub-period $P_1$. The power level of the radio-frequency power RF in the second sub-period $P_2$ may be 0 W.

In one embodiment, the first sub-period $P_1$ may be a period in which the pulsed negative DC voltage PV is applied to the base 18, and the second sub-period $P_2$ may be a period in which the pulsed negative DC voltage PV is not applied to the base 18. In another embodiment, the first sub-period $P_1$ may be a period in which the pulsed negative DC voltage PV is not applied to the base 18, and the second sub-period $P_2$ may be a period in which the pulsed negative DC voltage PV is applied to the base 18.

Although the exemplary embodiments have been described above, the embodiments are not restrictive, and various additions, omissions, substitutions, and changes may be made. The components in the different exemplary embodiments may be combined to form another exemplary embodiment.

The plasma processing apparatus according to another embodiment may be another capacitively coupled plasma processing apparatus different from the plasma processing apparatus 1. A plasma processing apparatus according to still another embodiment may be an inductively coupled plasma processing apparatus. A plasma processing apparatus according to still another embodiment may be an electron cyclotron resonance (ECR) plasma processing apparatus. A plasma processing apparatus according to still another embodiment may be a plasma processing apparatus that generates plasma using surface waves such as microwaves.

Figure 12:
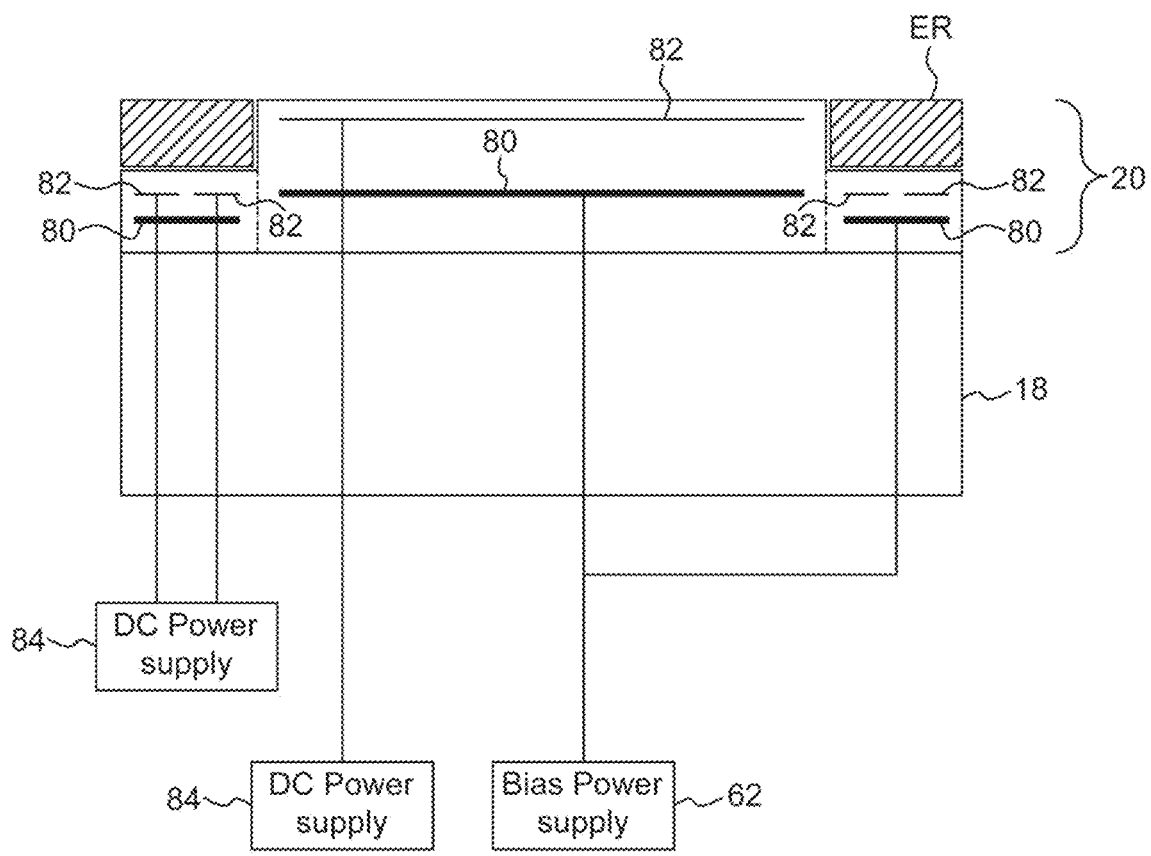
FIG. 12 is a schematic diagram of a substrate support according to an exemplary embodiment.

In another embodiment, shown in FIG. 12, the ESC 20 included in the substrate support 16 may include one or more bias electrodes 80 in the body. The RF power supply 61 (not shown in FIG. 12) is electrically connected to the base 18. The bias electrodes 80 may be coupled to the bias power supply 62 to receive the pulsed negative voltage. The bias electrodes 80 may be separate from the chuck electrode 82, or may also serve as the chuck electrode 82. The bias electrodes 80 may be coupled to the RF power supply 61, in addition to the bias power supply 62, to provide radio-frequency power RF to the bias electrodes 80. The bias electrode 80 below the edge ring ER may be coupled to different bias power supply instead of bias power supply 62.

The period $P_P$ may include three or more sub-periods, including the first sub-period $P_1$ and the second sub-period $P_2$. The durations of the three or more sub-periods included in the period $P_P$ may be the same or may be different from one another. In one embodiment, the power level of the radio-frequency power RF in each of the three or more sub-periods may be the same or may be different from the power level of the radio-frequency power RF in the preceding or following sub-periods.

The pulsed negative DC voltage PV shown in FIGS. 2 to 9 has a constant value for the negative peak voltage between the first transitional period and the second transitional period. In some embodiments, the pulsed negative DC voltage PV may have multiple voltage values between the first transitional period and the second transitional period.

Figure 11:
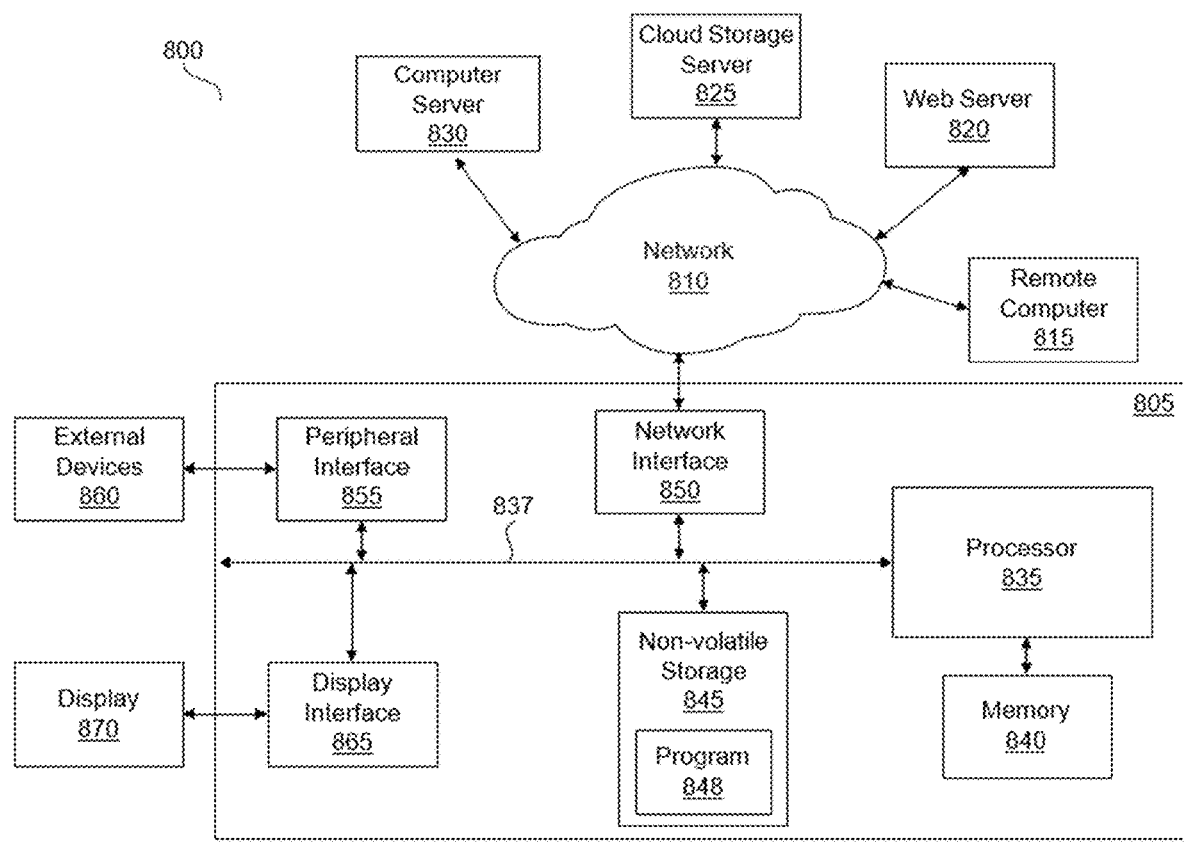
FIG. 11 is a diagram of controller circuitry used to control process operations, such as the plasma processing apparatus of FIG. 1 and other processes and equipment described herein.

FIG. 11 is a block diagram of processing circuitry for performing computer-based operations described herein. FIG. 11 illustrates processing circuitry 805 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 11, the processing circuitry 805 includes a processor (CPU) 835 which performs one or more of the control processes described above/below. The process data and instructions may be stored in memory 840. These processes and instructions (e.g., program 848) may also be stored on a storage medium disk 845 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 805 communicates, such as a server or computer.

Further, the claimed advancements may be provided as a utility application, background daemon, or component of an operating system, or combination thereof, executing in conjunction with CPU 835 and an operating system such as Microsoft Windows, UNIX, Solaris, LINUX, Apple MAC-OS and other systems known to those skilled in the art.

The hardware elements in order to achieve the processing circuitry 805 may be realized by various circuitry elements. Further, each of the functions of the above described embodiments may be implemented by circuitry, which includes one or more processing circuits. A processing circuit includes a particularly programmed processor, for example, processor (CPU) 835, as shown in FIG. 11. A processing circuit also includes devices such as an application specific integrated circuit (ASIC) and conventional circuit components arranged to perform the recited functions.

In FIG. 11, the processing circuitry 805 includes a CPU 835 which performs the processes described above. The processing circuitry 805 may be a general-purpose computer or a particular, special-purpose machine.

Alternatively, or additionally, the CPU 835 may be implemented on an FPGA, ASIC, PLD or using discrete logic circuits, as one of ordinary skill in the art would recognize. Further, CPU 835 may be implemented as multiple processors cooperatively working in parallel to perform the instructions of the inventive processes described above.

The processing circuitry 805 in FIG. 11 also includes a network controller such as an Intel Ethernet PRO network interface card from Intel Corporation of America, for interfacing with network 810 via the network interface 850. As can be appreciated, the network 810 can be a public network, such as the Internet, or a private network such as an LAN or WAN network, or any combination thereof and can also include PSTN or ISDN sub-networks. The network 810 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 805 further includes a display controller/display interface 865, such as a graphics card or graphics adaptor for interfacing with display 870, such as a monitor. A peripheral interface 855 interfaces with external devices 860 such as a keyboard, mouse, touch screen panel, etc. Peripheral interface 855 also connects to a variety of peripherals including printers and scanners. A processing circuitry system 800 can include the processing circuitry 805, along with a computer server 830, a cloud storage server 825, a web server 820, and a remote computer 815 which are connected to the processing circuitry 805 via the network 810. A description of the general features and functionality of the display 870, keyboard and/or mouse, as well as the display interface 865, the peripheral interface 855, the network interface 850, the computer server 830, the cloud storage server 825, the web server 820, and the remote computer 815 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
16 Substrate support
18 Base
20 Electrostatic chuck (ESC)
61 Radio-frequency (RF) power supply
62 Bias power supply
MC Controller

What is claimed is:

1. A plasma processing apparatus, comprising:
a chamber;
a substrate support including a base, at least one bias electrode, and an electrostatic chuck on the base, the substrate support to support a substrate placed on the substrate support in the chamber;
a radio-frequency power supply configured to generate radio-frequency power to be provided to generate plasma from a gas in the chamber;
a bias power supply electrically coupled directly to the at least one bias electrode to periodically apply a pulsed negative voltage to the at least one bias electrode, and the radio-frequency power supply is coupled to the base; and
processing circuitry configured to control the radio-frequency power supply to provide the radio-frequency power with a changed frequency within a period in which the pulsed negative voltage is applied from the bias power supply to the substrate support, to reduce a power level of a reflected wave from a load that is coupled to the radio-frequency power supply,
wherein the pulsed negative voltage has a first transitional period and a second transitional period, and the processing circuitry is configured to increase frequency of the radio-frequency power in the first transitional period of the pulsed negative voltage in which the pulsed negative voltage changes from 0V to a negative peak voltage and decrease frequency of the radio-frequency power in the second transitional period of the pulsed negative voltage in which the pulsed negative voltage changes from the negative peak voltage to 0V.

2. The plasma processing apparatus according to claim 1, wherein
the processing circuitry is configured to control the radio-frequency power supply to provide the radio-frequency power in at least a portion of a first sub-period that is included in the period, and to set a power level of the radio-frequency power in a second sub-period that is included in the period to a lower power level than in the first sub-period.

3. The plasma processing apparatus according to claim 2, wherein
the first sub-period is a period in which the pulsed negative voltage is applied to the substrate support, and
the second sub-period is a period in which the pulsed negative voltage is not applied to the substrate support.

4. The plasma processing apparatus according to claim 2, wherein
the first sub-period is a period in which the pulsed negative voltage is not applied to the substrate support, and
the second sub-period is a period in which the pulsed negative voltage is applied to the substrate support.

5. The plasma processing apparatus according to claim 1, wherein
the processing circuitry is configured to control the radio-frequency power supply to change the frequency of the radio-frequency power in accordance with a phase within the period to reduce the power level of the reflected wave within the period.

* * * * *